United States Patent
Ban et al.

(10) Patent No.: US 7,023,735 B2
(45) Date of Patent: Apr. 4, 2006

(54) METHODS OF INCREASING THE RELIABILITY OF A FLASH MEMORY

(75) Inventors: Amir Ban, Ramat Hasharon (IL); Simon Litsyn, Givat Shmuel (IL); Idan Alrod, Tel Aviv (IL)

(73) Assignee: Ramot at Tel-Aviv University Ltd., Tel-Aviv (IL)

( * ) Notice: Subject to any disclaimer, the term of this patent is extended or adjusted under 35 U.S.C. 154(b) by 0 days.

(21) Appl. No.: 10/867,646

(22) Filed: Jun. 16, 2004

(65) Prior Publication Data

US 2005/0013171 A1 Jan. 20, 2005

Related U.S. Application Data

(60) Provisional application No. 60/479,895, filed on Jun. 17, 2003.

(51) Int. Cl.
*G11C 16/06* (2006.01)
(52) U.S. Cl. .............................. 365/185.2; 365/185.24
(58) Field of Classification Search .............. 365/185.2
See application file for complete search history.

(56) References Cited

U.S. PATENT DOCUMENTS

| | | | | |
|---|---|---|---|---|
| 5,675,537 A | * | 10/1997 | Bill et al. | 365/185.22 |
| 5,724,284 A | * | 3/1998 | Bill et al. | 365/185.2 |
| 5,973,957 A | * | 10/1999 | Tedrow | 365/185.03 |
| 6,456,528 B1 | * | 9/2002 | Chen | 365/185.03 |

* cited by examiner

*Primary Examiner*—Thong Q. Le
(74) *Attorney, Agent, or Firm*—Mark M. Friedman

(57) ABSTRACT

A multi-level flash memory cell is read by comparing the cell's threshold voltage to a plurality of integral reference voltages and to a fractional reference voltage. Multi-level cells of a flash memory are programmed collectively with data and redundancy bits at each significance level, preferably with different numbers of data and redundancy bits at each significance level. The cells are read collectively, from lowest to highest significance level, by correcting the bits at each significance level according to the redundancy bits and adjusting the bits of the higher significance levels accordingly. The adjustment following the correction of the least significant bits is in accordance with comparisons of a cell's threshold voltages to fractional reference voltages.

20 Claims, 5 Drawing Sheets

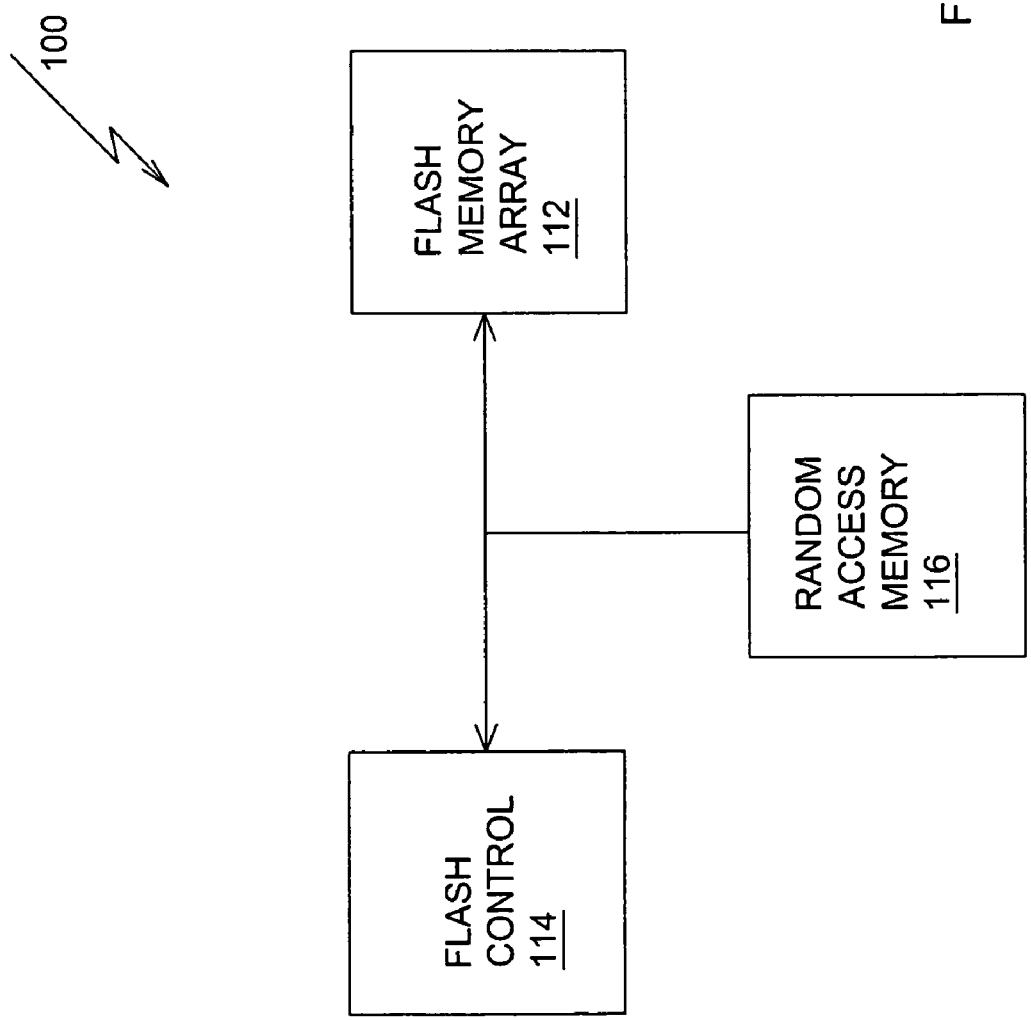

US 7,023,735 B2

1

METHODS OF INCREASING THE RELIABILITY OF A FLASH MEMORY

This is a continuation-in-part of U.S. Provisional Patent Application No. 60/479,895, filed Jun. 17, 2003

FIELD AND BACKGROUND OF THE INVENTION

The present invention relates to flash memories and, more particularly, to methods for reading such memories more reliably.

Originally, flash memories stored only one bit per cell. Flash memories that store two bits per cell now are available commercially, and flash memories that store more than two bits per cell are being developed. Flash memories that store one bit per cell are called "Single Level Cell" (SLC) memories. Flash memories that store more than one bit per cell are called "Multi Level Cell" (MLC) memories.

FIG. 1 illustrates how a bit pattern of three bits is stored in a MLC memory that is capable of storing three bits per cell.

The threshold voltage of a flash cell is in a range, called the "voltage window", from a minimum value $V_{min}$ to a maximum value $V_{max}$. For historical reasons, writing data to a flash cell is called "programming" the flash cell. This is done by applying voltage pulses to the cell, to inject electrons from the cell's silicon substrate through the cell's oxide layer into the cell's floating gate, until the threshold voltage of the cell is high enough within the voltage window to represent the desired bit pattern. In a three-bit-per-cell memory, the voltage window is divided into eight voltage bands: from $V_{min}$ to $V_1$, from $V_1$ to $V_2$, from $V_2$ to $V_3$, from $V_3$ to $V_4$, from $V_4$ to $V_5$, from $V_5$ to $V_6$, from $V_6$ to $V_7$ and from $V_7$ to $V_{max}$. A threshold voltage within one of the voltage bands represents a bit pattern as shown in FIG. 1: a threshold voltage between $V_{min}$ and $V_1$ represents the bit pattern "111", a threshold voltage between $V_1$ and $V_2$ represents the bit pattern "110", etc. In general, the voltage window of a m-bit-per-cell memory is divided into $2^m$ voltage bands.

To read a flash cell, the threshold voltage of the flash cell is compared to the reference voltages that define the voltage bands. In the case of some flash memories (hereinafter called "type 1" memories), reading a cell that stores a bit pattern of m bits requires m such comparisons. For example, when m=3, as illustrated in FIG. 1, the threshold voltage first is compared to $V_4$. Depending on the outcome of that comparison, the threshold voltage is compared to either $V_2$ or $V_6$. Depending on the outcome of the second comparison, the threshold voltage is compared to either $V_1$ or $V_3$ or $V_5$ or $V_7$. Note that this comparison does not assume prior knowledge of the threshold voltage: circuitry in the flash memory returns a signal indicating whether the threshold voltage is higher or lower than the reference voltage to which it is being compared.

In the case of some other flash memories (hereinafter called "type 2 memories"), the threshold values of all the cells that are read collectively are compared to all $2^m-1$ reference voltages between $V_{min}$ and $V_{max}$.

In a collection of flash cells, the threshold voltages of the cells are distributed statistically around the centers of their respective voltage bands. FIG. 1 shows the threshold voltages in the first voltage band distributed according to a distribution curve 10, the threshold voltages in the second voltage band distributed according to a distribution curve 12, the threshold voltages in the third voltage band distrib-

2 uted according to a distribution curve 14, the threshold voltages in the fourth voltage band distributed according to a distribution curve 16, the threshold voltages in the fifth band distributed according to a distribution curve 18, the threshold voltages in the sixth band distributed according to a distribution curve 20, the threshold voltages in the seventh band distributed according to a distribution curve 22 and the threshold voltages in the eighth band distributed according to a distribution curve 24. There are several reasons for the finite widths of these distributions:

1. The programming process is a stochastic one that relies on inherently stochastic processes such as quantum mechanical tunneling and hot injection.
2. The precision of the read/program circuitry is finite and is limited by random noise.
3. In some flash technologies, the threshold voltage of a cell being read is affected by the threshold voltages of neighboring cells.
4. Chip-to-chip variations and variations in the manufacturing process cause some cells to behave differently than other cells when read/programmed.

In addition, the threshold voltage distributions tend to change over time, as follows:

1. As a flash memory is programmed and erased, the voltage window tends to shrink and the voltage bands become biased. These phenomena limit the number of times a MLC flash memory can be erased and re-programmed.
2. The threshold voltage of a flash cell that is not programmed for a long time tends to drift downward. This phenomenon limits the time that data can be reliably retained in a flash memory.

The voltage bands of a flash cell should be designed to be wide enough to accommodate all these phenomena, but not too wide. A voltage band that is too narrow, relative to the associated threshold voltage distribution curve and relative to the drift of that curve over time, leads to an unacceptably high bit error rate. Making the voltage bands very wide relative to the associated threshold voltage distributions limits the number of bits in the bit patterns that can be stored in the flash cell. In practice, flash memories are designed to have one error per $10^{14}$–$10^{16}$ bits read. Some flash technologies are unable to achieve this error rate while storing the desired number of bits per cell. Some flash memories based on such technology use error correction circuits to compensate for their high intrinsic error rates. Some NAND flash manufacturers have instructed their customers to incorporate error-correcting code in their applications.

There is thus a widely recognized need for, and it would be highly advantageous to have, methods of reading flash cells that are more reliable than those known in the art.

DEFINITIONS

Reference voltages, such as the reference voltages illustrated in FIG. 1, that demark the boundaries of the voltage bands inside the voltage window, are termed "integral reference voltages" herein. The present invention introduces reference voltages that lie within voltage bands; such reference voltages are termed "fractional reference voltages" herein. Note that the voltages that define the voltage window itself ($V_{min}$ and $V_{max}$ in FIG. 1) are not considered reference voltages herein.

A bit pattern that has more than one bit has a least significant bit and a most significant bit. A bit pattern that has more than two bits has bits of different significance between the least significant bit and the most significant bit. In a bit pattern of m bits, the least significant bit is termed herein the bit of "significance level 0", the next-to-least significant bit is termed herein the bit of "significance level 1", etc., until the most significant bit is termed herein the bit of "significance level m−1".

Bits of one or more bit patterns also are grouped herein in "significance groups" that include bits of one or more significance levels. A significance group is a group of bits of consecutive significance levels. Like the significance levels of the bits of a bit pattern, the significance groups of the bits of one or more bit patterns are ordered from a least significant bit group to a most significant bit group. For example, the bits of three-bit bit patterns can be grouped into bit groups in four different ways. The first way is to form three bit groups: one bit group with the least significant bits (the bits of significance level 0), one bit group with the next-to-least significant bits (the bits of significance level 1), and one bit group with the most significant bits. The second way is to form two bit groups: one bit group with the least significant bits and one group with the bits of significance levels 1 and 2. The third way is to form two bit groups: one bit group with the bits of significance levels 0 and 1 and one bit group with the most significant bits. The fourth way is to treat the entire set of bit patterns as a single bit group.

SUMMARY OF THE INVENTION

According to the present invention there is provided a method of reading a plurality of cells of a flash memory, including the steps of: (a) for each cell: (i) determining at least one respective reference voltage for the each cell; and (ii) comparing a threshold voltage of the each cell to the at least one respective reference voltage.

According to the present invention there is provided a flash memory including: (a) a plurality of cells; and (b) for each cell: a circuit for: (i) reading a threshold voltage of at least one neighbor of the each cell, and (ii) setting at least one respective reference voltage for the each cell based on the threshold voltage of the at least one neighbor of the each cell.

According to the present invention there is provided a flash memory including: (a) a plurality of cells; and (b) a controller for: (i) obtaining a preliminary estimate of a threshold voltage of each cell by comparing the threshold voltage to at least one nominal reference voltage that is common to all the cells, and (ii) based on the preliminary estimates, determining at least one respective reference voltage for each cell.

According to the present invention there is provided a method of reading a plurality of flash memory cells, including the steps of (a) providing at least one integral reference voltage and at least one fractional reference voltage; (b) comparing a threshold voltage of each cell of the plurality to the at least one integral reference voltage and to the at least one fractional reference voltage to determine at least one statistic of the threshold voltages for the plurality of flash memory cells; and (c) adjusting at least one of the at least one integral reference voltage and the at least one fractional reference voltage in accordance with the at least one statistic.

According to the present invention there is provided a flash memory including: (a) a plurality of cells; and (b) a controller for reading the cells by: (i) providing at least one integral reference voltage and at least one fractional reference voltage, (ii) comparing a threshold voltage of each cell of the plurality to the at least one integral reference voltage and to the at least one fractional reference voltage to determine at least one statistic of the threshold voltages for the plurality of flash memory cells, and (iii) adjusting at least one of the at least one integral reference voltage and the at least one fractional reference voltage in accordance with the at least one statistic.

According to the basic method of the present invention, a flash cell (either a SLC cell or a MLC cell) is read by comparing the cell's threshold voltage to at least one integral reference voltage and to one or more fractional reference voltages.

Preferably, a plurality of integral reference voltages is provided, and the threshold voltage is compared to the fractional reference voltage(s) only if the comparison(s) to the integral reference voltages indicate that the threshold voltage is between the lowest and highest integral reference voltages.

Preferably, a plurality of integral reference voltages is provided, and if the comparisons of the cell's threshold voltage to the integral reference voltage(s) indicates that the threshold voltage is between two consecutive integral reference voltages, then the fractional reference voltage to which the threshold voltage is compared is between those two consecutive integral reference voltages.

One application of the basic method of the present invention is to storing and retrieving data in n MLC cells, m bits per cell. At each significance level p, from significance level 0 through significance level m−1, $k(p) \leq n$ data bits and (if $k(p)<n$) $n-k(p)$ corresponding redundancy bits are programmed into the cells. Reading the cells provides provisional retrieved values of the bits. Then, at each significance level, starting at significance level 0 and ending at significance level m−1, if $k(p)<n$, the provisional retrieved values of the bits of that significance level are corrected in accordance with the redundancy bits of that significance level to provide final retrieved values of the bits at that significance level. Then (except at significance level m−1), contingent on the final retrieved values at that significance level, the provisional retrieved values of the bits of higher significance level(s) are adjusted accordingly. Adjustment of the provisionally retrieved values of higher significance "contingent on" the final retrieved values at a level of lower significance means that, for any given cell, the provisionally retrieved values are not changed unless the final retrieved bit value for that cell at the lower significance level is different from the provisional retrieved bit value at the lower significance level.

Preferably, $k(p)$ is a nondecreasing function of p.

Preferably, the cells are read by comparing their threshold voltages to a plurality of integral reference voltages. Most preferably, after the provisional retrieved values of the bits of significance level 0 have been corrected, the provisional retrieved values of each cell's bit(s) of higher significance levels is/are adjusted in accordance with a comparison of the cell's threshold voltage to a fractional reference voltage. Also most preferably, the comparisons of the threshold voltages with the integral reference voltages assign each cell's threshold voltage to a voltage band of that cell. Then, after the provisional retrieved values of the bits of each significance level $0<p<m-1$ have been corrected, the provisional retrieved values of the bits of higher significance level(s) are adjusted by minimal reassignments of the assigned voltage bands. If two minimal reassignments are possible, the tie between the two reassignments is broken by selecting the reassignment that sets the provisional retrieved value of the bit of significance level p+1 equal to the provisional retrieved value of the bit of significance level p−1. Alternatively, if two minimal reassignments are possible, the tie between the two reassignments is broken by selecting the reassignment that sets the provisional retrieved value of the bit of significance level p+1 equal to the final retrieved value of the bit of significance level p−1.

This application of the basic method of the present invention is a special case of a more general method, in which data are stored in n MLC cells in at least two significance groups of bits, with each significance group including bits of q≧1 significance levels. Note that q need not have the same value for all the significance groups. For each significance group, a respective number k≦nq of data bits and (if k<nq) nq−k redundancy bits are programmed into the cells. Reading the cells provides provisional retrieved values of the bits. Then, for each significance group that has redundancy bits, starting at the least significant significance group, the provisional retrieved values of the bits of that significance group are corrected in accordance with the redundancy bits of that significance group, thereby providing final retrieved values of the bits of that significance group; and, except for the most significant significance group, the provisional retrieved values of the bits of the significance groups that are more significant than that significance group are adjusted contingent on the final retrieved values of the bits of that significance group.

The scope of the present invention also includes, as an invention in its own right, the programming of k(p)≦n data bits and n−k(p) redundancy bits in n MLC flash cells at each significance level p, provided that not all the numbers k(p) are equal.

The scope of the present invention also includes, as an invention in its own right, the programming of k≦nq data bits and nq−k redundancy bits in each significance group of bits, of q significance levels each, of n MLC flash cells that are operative to store a plurality of such significance groups of bits, provided that not all the numbers k are equal.

The scope of the present invention also includes flash memories for implementing the basic method of the present invention and its various applications. Each flash memory includes a plurality of flash cells and either a controller or analog circuitry for managing the flash cells in accordance with the present invention.

BRIEF DESCRIPTION OF THE DRAWINGS

The invention is herein described, by way of example only, with reference to the accompanying drawings, wherein:

FIG. 3 is a high-level schematic block diagram of a device of the present invention;

DESCRIPTION OF THE PREFERRED EMBODIMENTS

The present invention is a set of methods for reading flash memories more reliably than is possible according to the prior art.

The principles and operation of a flash memory according to the present invention may be better understood with reference to the drawings and the accompanying description.

Fractional Threshold Voltages

Figure 1:
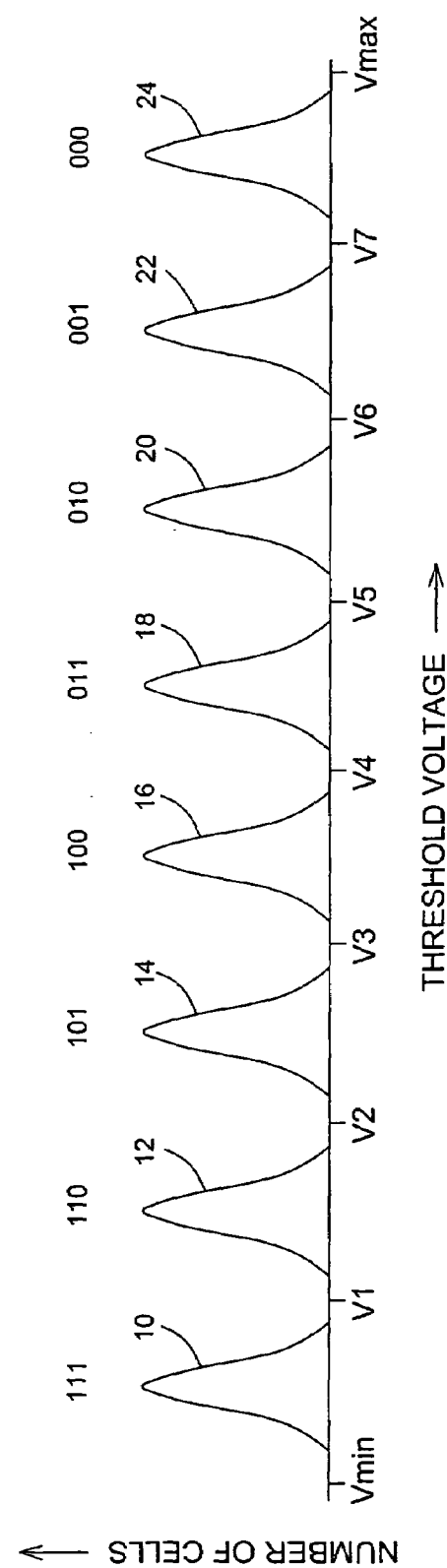
FIG. 1 illustrates the voltage bands of an eight-level flash cell.
Figure 2:
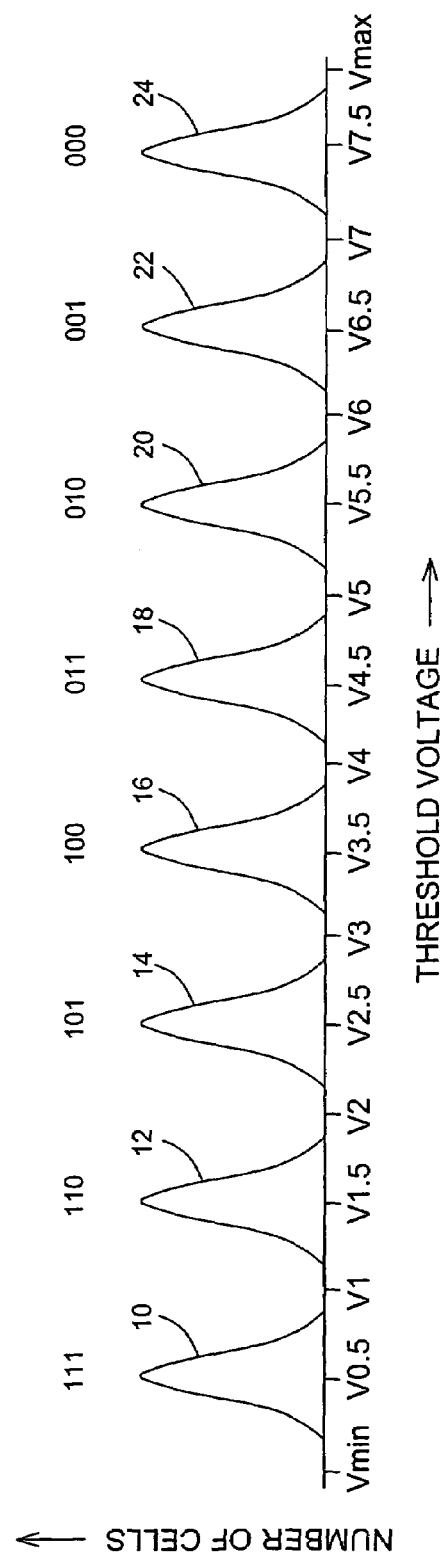
FIG. 2 is FIG. 1 including fractional reference voltages.

The basic innovation of the present invention is that, in addition to comparing the threshold voltages of flash cells to integral reference voltages, the threshold voltages also are compared to fractional reference voltages. Returning now to the drawings, FIG. 2 is FIG. 1 with the addition of eight fractional reference voltages, $V_{0.5}$, $V_{1.5}$, $V_{2.5}$, $V_{3.5}$, $V_{4.5}$, $V_{5.5}$, $V_{6.5}$ and $V_{7.5}$, in the centers of their respective voltage bands. In general, a flash cell for storing m bits has $2^m$ voltage bands and so has $2^m-1$ integral reference voltages. For example, in the case of a type 1 flash memory whose cells are read with m comparisons of a flash cell's threshold voltage to m of the $2^m-1$ integral reference voltages, reading such a flash cell according to the basic innovation of the present invention may also require comparing the flash cell's threshold voltages to one or more of the fractional voltages that lie between $V_1$ and $V_{2^m-1}$. For example, the last two comparisons of the flash cell's threshold voltage to the integral reference voltages $V_1$ through $V_{2^m-1}$ generally are to two consecutive such integral reference voltages. The fractional reference voltage to which the reference voltage then is compared typically lies between those two consecutive integral threshold voltages.

In the case of a type 2 flash memory whose cells are read by comparing the cells' threshold voltages to all $2^m-1$ integral reference voltages, the basic innovation of the present invention may require additional comparisons of the cells' threshold voltages to most or all of the fractional reference voltages that are defined to lie within the voltage bands.

The hardware that is used to compare a threshold voltage to fractional reference voltages is the same as the analog-to-digital hardware that is used in the prior art to compare a threshold voltage to integral reference voltages, for example a voltage comparator.

FIG. 3 is a high-level schematic block diagram of a device 100 of the present invention. FIG. 3 is adapted from FIG. 1 of Ban, U.S. Pat. No. 5,404,485, which patent is incorporated by reference for all purposes as if fully set forth herein. Device 100 includes an array 112 of flash memory cells that are controlled by a controller 114 with the assistance of a random access memory 116 as described in U.S. Pat. No. 5,404,485. If array 112 is an array of NAND flash cells, then controller 114 preferably also manages array 112 as taught in Ban, U.S. Pat. No. 5,937,425, which patent also is incorporated by reference for all purposes as if fully set forth herein. In addition, controller 114 reads the contents of the flash memory cells of array 112 by comparing the threshold voltages of the flash memory cells to both integral reference voltages and fractional reference voltages.

Collective Programming and Reading

One aspect of the present invention, that relies on comparing threshold voltages to fractional reference voltages, is based on storing in a flash memory, in addition to the data bits, redundancy bits determined according to an error-correcting code (ECC). Different numbers of redundancy bits may be used for data bits of different significance levels.

This aspect of the present invention first will be described by example, with reference to the m=3 case illustrated in FIG. 2, and then will be generalized to arbitrary values of m.

Consider, therefore, the programming of n m=3 flash cells according to the present invention. k(0)<n data bits are programmed as bits of significance level 0, k(1)<n data bits are programmed as bits of significance level 1, and k(2)<n data bits are programmed as bits of significance level 2. The remaining n−k(0) bits of significance level 0 are programmed as ECC redundancy bits for the k(0) data bits of significance level 0. The remaining n−k(1) bits of significance level 1 are programmed as ECC redundancy bits for the k(1) data bits of significance level 1. The remaining n−k(2) bits of significance level 2 are programmed as ECC redundancy bits for the k(2) data bits of significance level 2. Normally, k(0)≦k(1)≦k(2). This is because the bits of significance level 0 are inherently less reliable than the bits of significance level 1 and the bits of significance level 1 are inherently less reliable than the bits of significance level 2. This in turn is because there are seven possible threshold voltage comparisons (to reference voltages $V_1$ through $V_7$) that can cause an error in the reading of a bit of significance level 0, vs. three threshold voltage comparisons (to reference voltages $V_2$, $V_4$ and $V_6$) that can cause an error in the reading of a bit of significance level 1 and only one threshold voltage comparison (to reference voltage $V_4$) that can cause an error in the reading of a bit of significance level 2.

The n flash cells are read as described above. In the case of the type 1 flash cells discussed above, the cells are read, initially using comparisons of the threshold voltages only to the integral reference voltages. Subsequently, the cell's threshold voltages are compared to fractional reference voltages as needed, as described below. In the case of the type 2 flash cells discussed above, the cells are read using comparisons of the threshold voltages to both the integral reference voltages and the fractional reference voltages. Those skilled in the art will understand how to adapt this aspect of the present invention to other flash technologies. The comparisons with the integral reference voltages provide provisional retrieved values of the bits by a provisional assignment of which of the eight possible voltage bands the threshold voltage of each flash cell belongs to. Then the redundancy bits are used to correct the provisional values of the bits, separately for all three significance levels. The process of correcting the provisional values of a group of bits, that includes redundancy bits, with reference to the redundancy bits, is termed herein "decoding" the bits with respect to the redundancy bits. At each significance level other than the highest significance level, the correction based on the redundancy bits provides final retrieved values of the bits of that significance level, and also may indicate the need for changes in the provisional retrieved values at the higher significance level(s). At the lowest significance level, comparisons of the threshold voltages to the fractional reference voltages $V_{1.5}$ through $V_{6.5}$ also may be used to correct the provisional values.

Starting at the lowest significance level, the provisional values of the bits of significance level 0 are decoded with respect to the redundancy bits of significance level 0. If for any particular flash cell, this decoding changes the provisional value of the bit of significance level 0, this indicates that the flash cell's provisionally assigned voltage band was in error, so that the provisional values of the bits of higher significance level also may need to be corrected. Except for the lowest (111) and highest (000) voltage bands, correcting the provisional values of the bits of higher significance level requires a comparison of the flash cell's threshold voltage to the fractional reference voltage of the provisionally assigned voltage band. In the case of type 1 flash cells, the cell's threshold voltage now is compared to the fractional reference voltage of the provisionally assigned voltage band. In the case of type 2 flash cells, the cell's threshold voltage was compared to the fractional reference voltage of the provisionally assigned voltage band when the n cells were read.

If the flash cell's threshold voltage is less than that fractional reference voltage, then the provisional assignment of the voltage band needs to be moved down by one voltage band. If the flash cell's threshold voltage is greater than the fractional reference voltage, then the provisional assignment of the voltage band needs to be moved up by one voltage level.

For example, suppose that the flash cell's provisionally assigned voltage band is the 110 band and that the decoding of the provisional values of the bits of significance level 0 shows that the flash cell's bit of significance level 0 is really "1", not "0". Based on this information, the actual voltage band of the flash cell could be either 111 or 101. If the comparison of the flash cell's threshold voltage to $V_{1.5}$ shows that the flash cell's threshold voltage is less than $V_{1.5}$, then the provisional assignment of the flash cell's voltage band is changed to 111. No change in the provisional values of the bits of higher significance level is needed. If the comparison of the flash cell's threshold voltage to $V_{1.5}$ shows that the flash cell's threshold voltage is greater than $V_{1.5}$, then the provisional assignment of the flash cell's voltage band is changed to 101. This change in the provisional assignment of the flash cell's voltage band also changes the provisional value of the bit of significance level 1 from "1" to "0".

Or suppose that the flash cell's provisionally assigned voltage band is 111 and that the decoding of the provisional values of the bits of significance level 0 shows that the flash cell's bit of significance level 0 is really "0", not "1". Based on this information, the actual voltage band of the flash cell must be 110. The comparisons of the flash cell's threshold voltage to the fractional reference voltages are not needed to make this assignment. In addition, the change in the provisional assignment of the flash cell's voltage band does not change the provisional values of the bits of higher significance level.

Next, the provisional values of the bits of significance level 1 are decoded with respect to the redundancy bits of significance level 1. If for any particular flash cell, this decoding changes the provisional value of the bit of significance level 1, this indicates that the flash cell's provisionally assigned voltage band was in error, so that the provisional values of the bits of significance level 2 also may need to be corrected. As in the case of the bits of significance level 0, the provisional assignment of the flash cell's voltage band could be changed by moving the voltage band up or down. Unlike the case of the bits of significance level 0, the indicated change in one direction may be less than the indicated change in the other direction. In that case, the smaller of the two indicated changes is the change actually made. If the two indicated changes are of equal magnitude, the bit of significance level 0 is used to break the tie.

For example, suppose that the flash cell's initial provisionally assigned voltage band is 110, that decoding the provisional values of the bits of significance level 0 and the comparison of the flash cell's threshold voltage to $V_{1.5}$ changes the provisionally assigned voltage band to 111, and that decoding the provisional values of the bits of significance level 1 shows that the flash cell's bit of significance level 1 is really "0", not "1". This indicates that the flash cell's voltage band could be either 101 or 001. Voltage band 101 is only one voltage band away from the initial provisional assignment. Voltage band 001 is five voltage bands away from the initial provisional assignment. The provisional assignment of the flash cell's voltage band is changed to 101. No change in the provisional value of the bit of significance level 2 is required (yet).

Or suppose that the flash cell's initial provisionally assigned voltage band is 100, that decoding the provisional values of the bits of significance level 0 and the comparison of the flash cell's threshold voltage to $V_{3.5}$ changes the provisionally assigned voltage band to 101, and that decoding the provisional values of the bits of significance level 1 shows that the flash cell's bit of significance level 1 is really "1", not "0". This indicates that the flash cell's voltage band could be either 111 or 011. Voltage band 111 is three voltage bands away from the initial provisional assignment. Voltage band 011 is one voltage band away from the initial provisional assignment. The provisional assignment of the flash cell's voltage band is changed to 011, thereby changing the provisional value of the bit of significance level 2 from "1" to "0".

Or suppose that the flash cell's initial provisionally assigned voltage band is 111, that decoding the provisional values of the bits of significance level 0 changes the provisionally assigned voltage band to 110, and that decoding the provisional values of the bits of significance level 1 shows that the flash cell's bit of significance level 1 is really "0", not "1". This indicates that the flash cell's voltage band could be either 100 or 000. Voltage band 100 is three voltage bands away from the initial provisional assignment. Voltage band 000 is seven voltage bands away from the original assignment. The provisional assignment of the flash cell's voltage band is changed to 100. No change in the provisional value of the bit of significance level 2 is needed (yet).

Or suppose that the flash cell's initial provisionally assigned voltage band is 011, that decoding the provisional value of the bits of significance level 0 does not change the provisionally assigned voltage band, and that decoding the provisional values of the bits of significance level 1 shows that the flash cell's bit of significance level 1 is really "0", not "1". This indicates that the flash cell's voltage band could be either 101 or 001. Both of those voltage bands are two voltage bands away from the initial provisional assignment. The bit of significance level 0, being "1" and therefore representative of a lower threshold voltage than the alternative "0", is used to break the tie in favor of the lower voltage band, ie., "101".

Finally, the provisional values of the bits of significance level 2 are decoded with respect to the redundancy bits of significance level 2, and any of the provisional values of the bits of significance level 2 that are changed by the decoding are replaced.

Figure 4A:
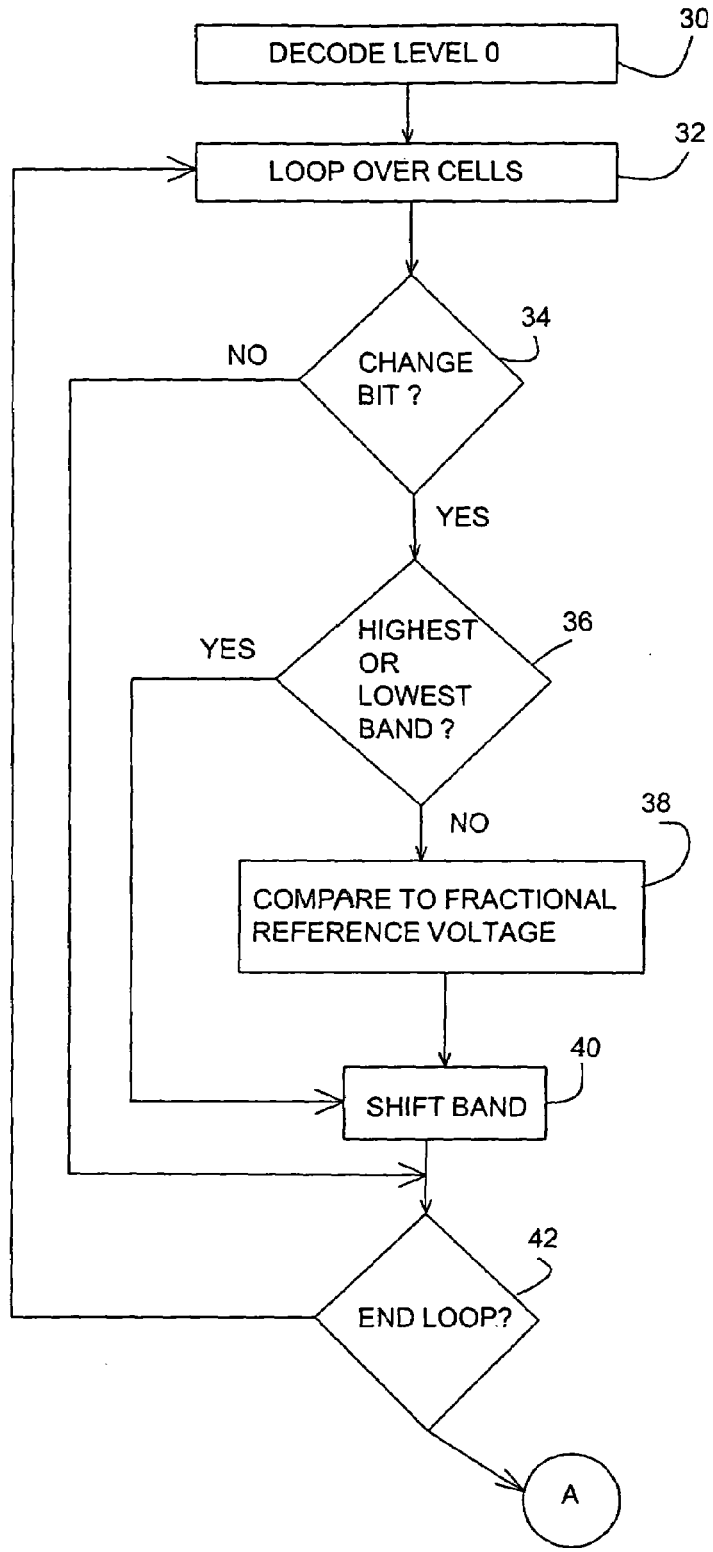
FIGS. 4A and 4B are a flowchart of the method of the present invention for reading collectively programmed data.
Figure 4B:
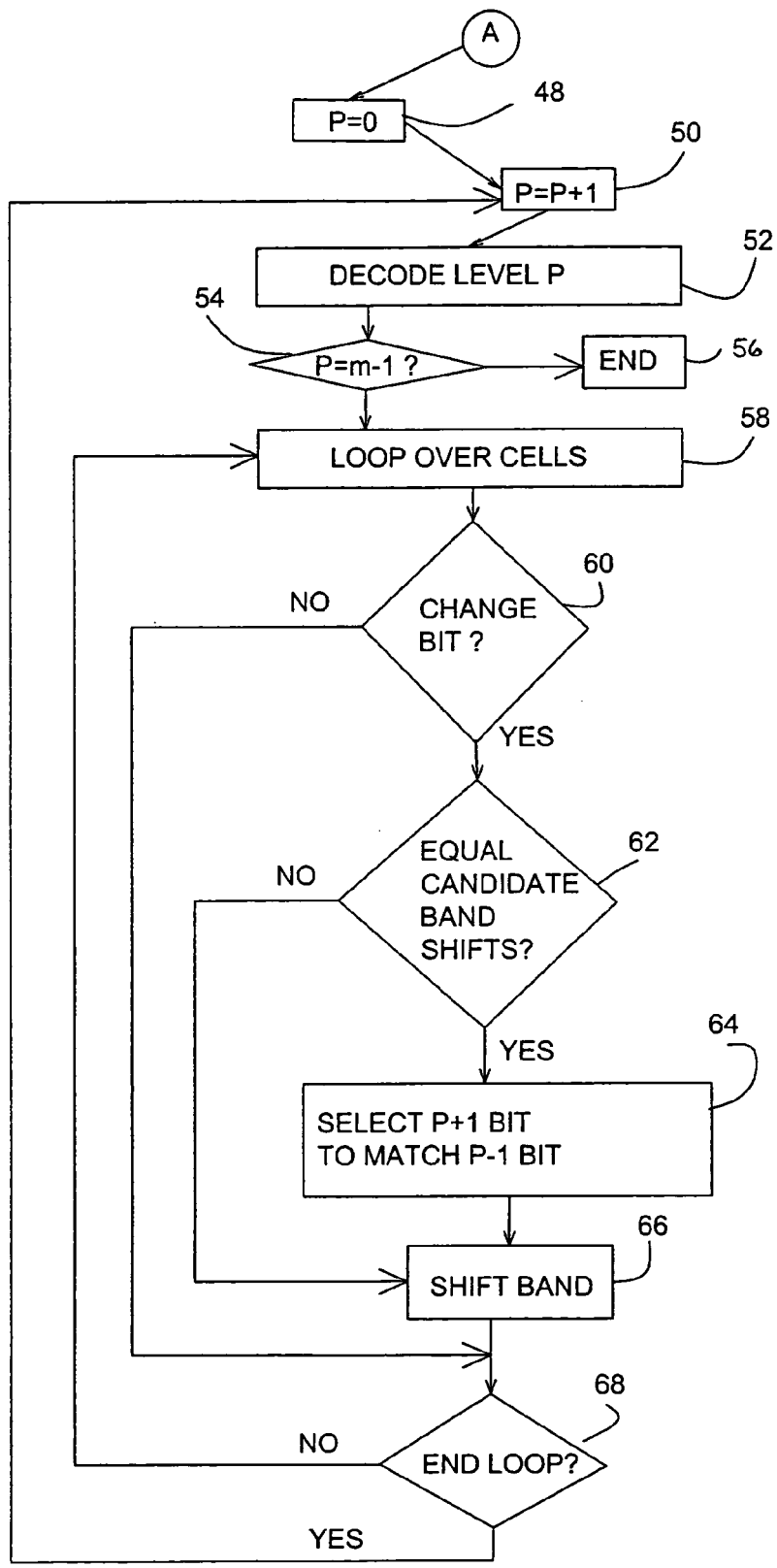

FIGS. 4A and 4B are a flowchart of the method for general m, with k(p) data bits protected by n–k(p) redundancy bits programmed in n flash cells at each level of significance p. As in the m=3 example, k(p) normally is a nondecreasing function of p because bits of a higher level of significance generally are more reliable than bits of a lower level of significance. It also follows that the bits of a lower level of significance generally require a more capable error correcting code than the bits of a higher level of significance.

In block 30, the bits of significance level 0 are decoded. Block 32 starts a loop over the flash cells. In a cell whose bit of significance level 0 is changed by the decoding (block 34), the provisionally assigned voltage band must be reassigned up or down by one voltage band. In the case of the highest (lowest) voltage band (block 36), that reassignment must be down (up). Otherwise, in block 38, the comparison of the flash cell's threshold voltage to the fractional reference voltage in the middle of the provisionally assigned voltage band is used to determine whether to reassign the provisionally assigned voltage band up or down. Depending on the outcome of that comparison, the provisionally assigned voltage band is reassigned up or down in block 40, and the provisional values of the bits of higher significance level are changed accordingly. Blocks 34–40 are traversed until all the flash cells have been considered (block 42).

Blocks 48 and 50 start an outer loop over the bits of significance level p>0. In block 52, the bits of significance level p are decoded. Unless p is the highest significance level (blocks 54 and 56), a loop over the flash cells is entered in block 58. In a cell whose bit of significance level p is changed by the decoding (block 60), the provisionally assigned voltage band must be reassigned up or down accordingly, possibly with an accompanying change in the bits whose significance levels exceed p. Of all the possible reassignments, the minimal reassignment, i.e., the reassignment to the nearest candidate voltage band, is selected. If there are two minimal reassignments (block 62), the reassignment whose bit of significance level p+1 matches the previously determined bit of significance level p–1 is selected in block 64. The selected reassignment is applied in block 66, and the provisional values of the bits of significance level greater than p are changed accordingly. Blocks 60–66 are traversed until all the flash cells have been considered (block 68).

If, for some value of m, the bits of significance levels higher than some number m'–1 are considered sufficiently reliable to not need protection by redundancy bits, then all the bits of significance levels higher than m'–1 are programmed as data bits and decision block 54 compares p to m'–1 rather than to m–1. In the special case of only the bits of significance level 0 being protected by redundancy bits, only the blocks of FIG. 4A are executed.

In the description above, the tie-breaking comparison in block 64 is with reference to the final retrieved value of the bit of significance level p–1. Alternatively, the tie-breaking comparison in block 64 is with reference to the provisional value of the bit of significance level p–1 as originally retrieved.

More generally, the bits stored in the flash cells may be corrected in multi-level significance groups. For example, in the case of m=3, after the lowest order bits are decoded and after the bits of significance levels 1 and 2 are corrected with reference to the fractional reference voltages, optionally all the bits of significance levels 1 and 2 are corrected collectively according to the ECC redundancy bits of significance levels 1 and 2. The flowchart of FIGS. 4A and 4B illustrates the special case of each significance group including only one significance level. It will be clear to those skilled in the art how to generalize the flowchart of FIGS. 4A and 4B to the general case of multi-level significance groups.

FIG. 3, in addition to illustrating a basic device 100 of the present invention, also illustrates a device 100 for collective programming and reading of an array 112 of MLC flash cells as described above. In addition to managing array 112 as described in U.S. Pat. Nos. 5,404,485 and 5,937,425, controller 114 also programs and reads the flash cells of array 112 and corrects the provisional values of the read bits collectively as described above.

In the case of not all values of k(p) being equal, the programming of n multi-level flash cells to store k(p) data bits and n–k(p) redundancy bits at each significance level p is an invention in its own right. Again, FIG. 3, in addition to illustrating a basic device 100 of the present invention, also illustrates a device 100 for collective programming of an array 112 of MLC flash cells. In addition to managing array 112 as described in U.S. Pat. Nos. 5,404,485 and 5,937,425, controller 114 also programs the flash cells of each page of n flash cells to store k(p) data bits and n–k(p) redundancy bits at each significance level p, with the option of not all values of k(p) for any particular page being equal.

Storing More than m Bits Per Cell

Ban et al., in U.S. Pat. No. 6,469,931, which patent is incorporated by reference for all purposes as if fully set forth herein, teach a method of using n flash cells with q (not necessarily equal to a power of 2) voltage bands each to store more than nm bits, where $2^m$ is the largest power of 2 that is less than or equal to q. The collective voltage bands of the n flash cells are close-packed n-dimensional hyperspheres. Ban et al. teach reading the n cells by comparing their threshold voltages to their integral reference voltages, and present an example in which q=3. Also, or instead, comparing the threshold voltages to the fractional voltages of the present invention, obviously would improve the robustness of this method.

While the invention has been described with respect to a limited number of embodiments, it will be appreciated that many variations, modifications and other applications of the invention may be made.

What is claimed is:

1. A method of operating a flash memory cell, comprising the steps of:
    (a) programming the cell to store data; and
    (b) subsequent to said programming, reading the cell by steps including:
        (i) comparing a threshold voltage of the cell to at least one integral reference voltage; and
        (ii) comparing said threshold voltage of the cell to at least one fractional reference voltage.

2. The method of claim 1, further comprising the step of:
    (c) providing a plurality of said integral reference voltages; and wherein said comparing of said threshold voltage of the cell to said at least one fractional reference voltage is effected only if said comparing of said threshold voltage of the cell to said at least one integral reference voltage indicates that said threshold voltage of the cell is higher than a lowest of said integral reference voltages and lower than a highest of said integral reference voltages.

3. The method of claim 1, further comprising the step of:
    (c) providing a plurality of said integral reference voltages; and wherein, if said comparing of said threshold voltage of the cell to said plurality of integral reference voltages indicates that said threshold voltage of the cell is between two consecutive said integral reference voltages, then said at least one fractional reference voltage also is between said two consecutive integral reference voltages.

4. A flash memory device, comprising:
    (a) at least one flash memory cell; and
    (b) a controller operative to operate each said flash memory cell by steps including:
        (i) programming the cell to store data, and
        (ii) subsequent to said programming, reading the cell by steps including:
            (A) comparing a threshold voltage of said each flash memory cell to at least one integral reference voltage, and
            (B) comparing said threshold voltage of said each flash memory cell to at least one fractional reference voltage.

5. A method of storing data, comprising the steps of:
    (a) providing n cells, of a multi-level flash memory, that are operative to store at least m>1 bits each; and
    (b) for each integer p from 0 through m−1:
        (i) programming a number k(p)≦n of said cells to store k(p) bits of the data as bits of significance level p, and
        (ii) if k(p)<n, programming a remaining n−k(p) of said cells to store n−k(p) corresponding redundancy bits as bits of significance level p;
    wherein said number k(p), for at least one value of said integer p, has a value different from that of said number k(p) for at least one other value of said integer p.

6. A flash memory device, comprising:
    (a) n flash memory cells operative to store at least m>1 bits each; and
    (b) a controller operative to store data in said cells by, for each integer p from 0 through m−1:
        (i) programming a number k(p)≦n of said cells to store k(p) bits of the data as bits of significance level p, and
        (ii) if k(p)<n, programming a remaining n−k(p) of said cells to store n−k(p) corresponding redundancy bits as bits of significance level p;
    with said number k(p), for at least one value of said integer p, having a value different from that of said number k(p) for at least one other value of said integer p.

7. A method of storing and retrieving data, comprising the steps of:
    (a) providing n cells, of a multi-level flash memory, that are operative to store at least m>1 bits each;
    (b) for each integer p from 0 through m−1:
        (i) programming a number k(p)≦n of said cells to store k(p) bits of the data as bits of significance level p, and
        (ii) if k(p)<n, programming a remaining n−k(p) of said cells to store n−k(p) corresponding redundancy bits as bits of significance level p;
    (c) reading said n cells to determine provisional retrieved values of said stored bits; and
    (d) for each integer p from 0 through m−1: if k(p)<n:
        (i) correcting said provisional retrieved values of said bits of significance level p according to said provisional retrieved values of said redundancy bits of significance level p, thereby providing final retrieved values of said bits of significance level p, and
        (ii) if p is less than m−1, adjusting said provisional retrieved values of said bits of significance levels p+1 through m−1 contingent on said final retrieved values of said bits of significance level p.

8. The method of claim 7, wherein k(p) is a nondecreasing function of p.

9. The method of claim 7, wherein, for each of said n cells, said reading of said each cell is effected by steps including comparing a threshold voltage of said each cell to a plurality of integral reference voltages.

10. The method of claim 9, wherein, subsequent to said correcting of said provisional retrieved values of said bits of significance level 0, for each of said n cells, said adjusting of said provisional retrieved values of said bits of significance levels 1 through m−1 is effected in accordance with a comparison of said threshold value of said each cell to a fractional reference voltage.

11. The method of claim 9, wherein, for each of said n cells, said comparing of said threshold voltage of said each cell to said plurality of integral reference voltages assigns said threshold voltage of said each cell to a voltage band of said each cell, and wherein, subsequent to said correcting of said provisional retrieved values of said bits of significance level 0<p<m−1, for each of said n cells, said adjusting of said provisional retrieved values of said bits of significance levels p+1 through m−1 is effected by a minimal reassignment of said voltage band to which said threshold voltage of said each cell is assigned.

12. The method of claim 11, wherein, if two said reassignments are minimal reassignments, said adjusting of said provisional retrieved values of said bits of significance levels p+1 through m−1 is effected by said reassignment that sets said provisional retrieved value of said bit of significance level p+1 equal to said provisional retrieved value of said bit of significance level p−1.

13. The method of claim 11, wherein, if two said reassignments are minimal reassignments, said adjusting of said provisional retrieved values of said bits of significance levels p+1 through m−1 is effected by said reassignment that sets said provisional retrieved value of said bit of significance level p+1 equal to said final retrieved value of said bit of significance level p−1.

14. A flash memory device, comprising:
(a) n flash memory cells operative to store at least m>1 bits each; and
(b) a controller operative to store and retrieve data from said cells by:
  (i) for each integer p from 0 through m−1:
    (A) programming a number k(p)≦n of said cells to store k(p) bits of the data as bits of significance level p, and
    (B) if k(p)<n, programming a remaining n−k(p) of said cells to store n−k(p) corresponding redundancy bits as bits of significance level p,
  (ii) reading said n cells to determine provisional retrieved values of said stored bits, and
  (iii) for each integer p from 0 through m−1: if k(p)<n:
    (A) correcting said provisional retrieved values of said bits of significance level p according to said provisional retrieved values of said redundancy bits of significance level p, thereby providing final retrieved values of said bits of significance level p, and
    (B) if p is less than m−1, adjusting said provisional retrieved values of said bits of significance levels p+1 through m−1 contingent on said final retrieved values of said bits of significance level p.

15. A method of storing data, comprising the steps of:
(a) providing n cells, of a multi-level flash memory, that are operative to store at least two significance groups of bits, each said significance group including bits of a respective number q≧1 of consecutive significance levels; and
(b) for each said significance group:
  (i) programming said cells to store a respective number k≦nq bits of the data as bits having significance levels within said each significance group, and
  (ii) if k is less than nq, programming said cells to store nq−k corresponding redundancy bits as bits having significance levels within said each significance group;
wherein said number k, for at least one said significance group, has a value different from that of said number k for at least one other said significance group.

16. A flash memory device, comprising:
(a) n flash memory cells operative to store at least two significance groups of bits, each said significance group including bits of a respective number q≧1 of consecutive significance levels; and
(b) a controller operative to store and retrieve data from said cells by, for each said significance group:
  (i) programming said cells to store a respective number k≦nq bits of said data as bits having significance levels within said each significance group, and
  (ii) if k is less than nq, programming said cells to store nq−k corresponding redundancy bits as bits having significance levels within said each significance group;
with said number k, for at least one said significance group, having a value different from that of said number k for at least one other said significance group.

17. A method of storing and retrieving data, comprising the steps of:
(a) providing n cells, of a multi-level flash memory, that are operative to store at least two significance groups of bits, each said significance group including bits of a respective number q≧1 of consecutive significance levels;
(b) for each said significance group:
  (i) programming said cells to store a respective number k≦nq bits of the data as bits having significance levels within said each significance group, and
  (ii) if k is less than nq, programming said cells to store nq−k corresponding redundancy bits as bits having significance levels within said each significance group;
(c) reading said n cells to determine provisional retrieved values of said stored bits; and
(d) for each said significance group: if said respective number k is less than nq:
  (i) correcting said provisional retrieved values of said bits that have significance levels within said each significance group according to said provisional retrieved values of said redundancy bits that have significance levels within said each significance group, thereby providing final retrieved values of said bits that have significance levels within said each significance group, and
  (ii) for each said significance group other than a most significant said significance group, adjusting said provisional retrieved values of said bits of significance groups more significant than said each significance group contingent on said final retrieved values of said bits that have significance levels within said each significance group.

18. A flash memory device, comprising:
(a) n flash memory cells operative to store at least two significance groups of bits, each said significance group including bits of a respective number q≧1 of consecutive significance levels; and
(b) a controller operative to store and retrieve data from said cells by:
  (i) for each said significance group:
    (A) programming said cells to store a respective number k≦nq bits of said data as bits having significance levels within said each significance group, and
    (B) if k is less than nq, programming said cells to store nq−k corresponding redundancy bits as bits having significance levels within said each significance group,
  (ii) reading said n cells to determine provisional retrieved values of said stored bits, and
  (iii) for each said significance group: if said respective number k is less than nq:

(A) correcting said provisional retrieved values of said bits that have significance levels within said each significance group according to said provisional retrieved values of said redundancy bits that have significance levels within said each significance group, thereby providing final retrieved values of said bits that have significance levels within said each significance group, and (B) for each said significance group other than a most significant said significance group, adjusting said provisional retrieved values of said bits of significance groups more significant than said each significance group contingent on said final retrieved values of said bits that have significance levels within said each significance group.

19. A method for storing and retrieving a binary number, comprising the steps of:
   (a) providing a memory including a number n, greater than 1, of cells, each said cell having a respective adjustable threshold voltage;
   (b) setting said threshold voltages to collectively represent the number;
   (c) estimating said threshold voltages by steps including comparing said threshold voltages to at least one fractional reference voltage; and
   (d) decoding said estimated threshold voltages collectively to recover the number.

20. A storage device for storing a binary number of b bits, comprising:
   (a) a memory having a plurality n of m-bits-per-cell cells, n being smaller than b/m;
   (b) a plurality of adjustable threshold voltages used to represent the bits;
   (c) a storing mechanism to collectively set said adjustable threshold voltages to store the number in said memory; and
   (d) a retrieving mechanism to collectively estimate said threshold voltages by steps including comparing said threshold voltages to at least one fractional reference voltage in order to retrieve the number from said memory.

* * * * *